US011639550B2

(12) United States Patent
Kim et al.

(10) Patent No.: US 11,639,550 B2
(45) Date of Patent: May 2, 2023

(54) APPARATUS AND METHOD OF DEPOSITING A THIN LAYER

(71) Applicant: SAMSUNG ELECTRONICS CO., LTD., Suwon-si (KR)

(72) Inventors: Dong-Gu Kim, Cheonan-si (KR); Homin Son, Seoul (KR); Junghyeon Kim, Yongin-si (KR); Hangkyu Song, Hwaseong-si (KR); Eunha Oh, Suwon-si (KR); Oleg Feygenson, Hwaseong-si (KR); Donghyun Jang, Incheon (KR); Sung-Woo Jeon, Hwaseong-si (KR); Wooyeon Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/501,146

(22) Filed: Oct. 14, 2021

(65) Prior Publication Data
US 2022/0333247 A1 Oct. 20, 2022

(30) Foreign Application Priority Data
Apr. 15, 2021 (KR) .................. 10-2021-0049323

(51) Int. Cl.
*H01L 21/67* (2006.01)
*C23C 16/46* (2006.01)
(Continued)

(52) U.S. Cl.
CPC .......... *C23C 16/46* (2013.01); *C23C 16/448* (2013.01); *C23C 16/45502* (2013.01); *H01L 21/0228* (2013.01); *C23C 16/458* (2013.01)

(58) Field of Classification Search
CPC .......... H05B 6/104; H05B 6/36; H05B 6/362; H05B 6/365; H05B 6/108; F24H 1/101;
(Continued)

(56) References Cited

U.S. PATENT DOCUMENTS 6,835,039 B2   12/2004   van den Berg et al.
8,304,328 B2   11/2012   Maeda et al.
(Continued)

FOREIGN PATENT DOCUMENTS

KR   10-2004-0009385 A   1/2004
KR   10-2006-0018995 A   3/2006
(Continued)

OTHER PUBLICATIONS

Roenigk et al., J. Electrochem. Soc., 134, 1777 (1987).

*Primary Examiner* — Rudy Zervigon
(74) *Attorney, Agent, or Firm* — Lee IP Law, P.C.

(57) ABSTRACT

An apparatus for depositing a thin layer and associated method, the apparatus including a process chamber; a support in the process chamber, substrates being supportable on the support at different heights; a gas injector configured to inject a gas into the process chamber; and a heater configured to heat the process chamber, wherein the gas injector includes a first injector configured to inject a first gas; and a second injector configured to inject a second gas, a flow rate of the first gas injected from the first injector ranges from 120 sccm to 240 sccm, and a flow rate of the second gas injected from the second injector ranges from 1,200 sccm to 2,400 sccm.

18 Claims, 12 Drawing Sheets

(51) Int. Cl.
*H01L 21/02* (2006.01)
*C23C 16/455* (2006.01)
*C23C 16/448* (2006.01)
*C23C 16/458* (2006.01)

(58) Field of Classification Search
CPC . C23C 16/46; C23C 16/448; C23C 16/45502; C23C 16/458; C23C 16/54; C23C 16/45551; C23C 16/545; H01L 21/0228; H01L 21/6719; H01L 21/67196; H01L 21/67201; H01L 21/67173; H01L 21/67184; H01L 21/6776; H01L 21/67161; H01L 21/67155
USPC ............. 118/719, 725; 156/345.31, 345.32, 156/345.37, 345.52; 219/264, 630, 673, 219/674, 675, 236
See application file for complete search history.

(56) References Cited

U.S. PATENT DOCUMENTS

| | | | |
|---|---|---|---|
| 9,798,317 | B2 | 10/2017 | Takenaga et al. |
| 2007/0178669 | A1* | 8/2007 | Noda .................. C23C 16/4408 257/E21.106 |
| 2009/0130829 | A1* | 5/2009 | Noda .................. C23C 16/0227 257/E21.101 |
| 2012/0247391 | A1 | 10/2012 | Endo et al. |
| 2018/0135179 | A1 | 5/2018 | Ikeuchi et al. |
| 2018/0355481 | A1 | 12/2018 | Kang et al. |

FOREIGN PATENT DOCUMENTS

| | | |
|---|---|---|
| KR | 10-0972346 B1 | 7/2010 |
| KR | 10-1016016 B1 | 2/2011 |

\* cited by examiner

APPARATUS AND METHOD OF DEPOSITING A THIN LAYER

CROSS-REFERENCE TO RELATED APPLICATION

This U.S. non-provisional patent application claims priority under 35 U.S.C. § 119 to Korean Patent Application No. 10-2021-0049323, filed on Apr. 15, 2021, in the Korean Intellectual Property Office, the disclosure of which is hereby incorporated by reference in its entirety.

BACKGROUND

1. Field

Embodiments relate to an apparatus and a method of depositing a thin layer.

2. Description of the Related Art

Semiconductor devices may be manufactured using various semiconductor manufacturing processes such as deposition processes, ion implantation processes, photolithography processes, and/or etching processes. The deposition process among these processes may be a process of forming a thin layer or a material layer on a substrate and may use a chemical vapor deposition (CVD) method or an atomic layer deposition (ALD) method as a deposition method.

SUMMARY

The embodiments may be realized by providing an apparatus for depositing a thin layer, the apparatus including a process chamber; a support in the process chamber, substrates being supportable on the support at different heights; a gas injector configured to inject a gas into the process chamber; and a heater configured to heat the process chamber, wherein the gas injector includes a first injector configured to inject a first gas; and a second injector configured to inject a second gas, a flow rate of the first gas injected from the first injector ranges from 120 sccm to 240 sccm, and a flow rate of the second gas injected from the second injector ranges from 1,200 sccm to 2,400 sccm.

The embodiments may be realized by providing an apparatus for depositing a thin layer, the apparatus including a process chamber; a support in the process chamber, substrates being supportable on the support at different heights; a gas injector configured to inject a gas into the process chamber; and a heater configured to heat the process chamber, wherein the process chamber includes a first temperature region, a second temperature region, a third temperature region, a fourth temperature region, and a fifth temperature region, which are sequentially provided in a direction from a lower portion of the process chamber toward an upper portion of the process chamber, a temperature in degrees Celsius in the first temperature region of the process chamber is a first temperature, a temperature in degrees Celsius in the fifth temperature region of the process chamber is a second temperature, and a ratio of the first temperature to the second temperature ranges from 1:1.01 to 1:1.03.

The embodiments may be realized by providing a method of depositing a thin layer, the method including loading substrates at different heights in a process chamber; injecting a first gas and a second gas into the process chamber to deposit a thin layer on each of the substrates; and independently controlling temperatures at different heights in the process chamber, wherein a flow rate of the first gas injected into the process chamber ranges from 120 sccm to 240 sccm, and a flow rate of the second gas injected into the process chamber ranges from 1,200 sccm to 2,400 sccm.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
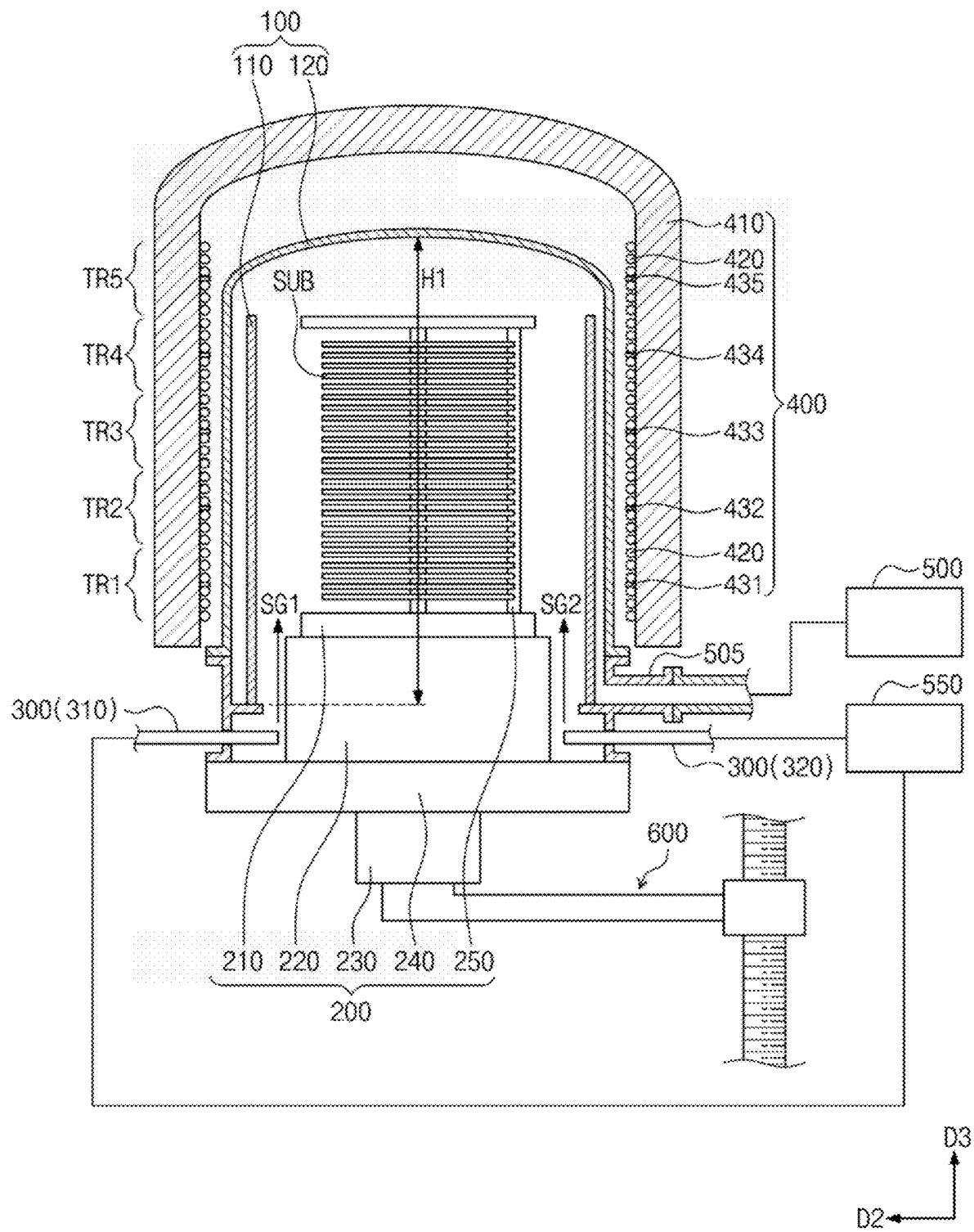
FIG. 1 is a schematic view of an apparatus for depositing a thin layer, according to some embodiments.
Figure 2:
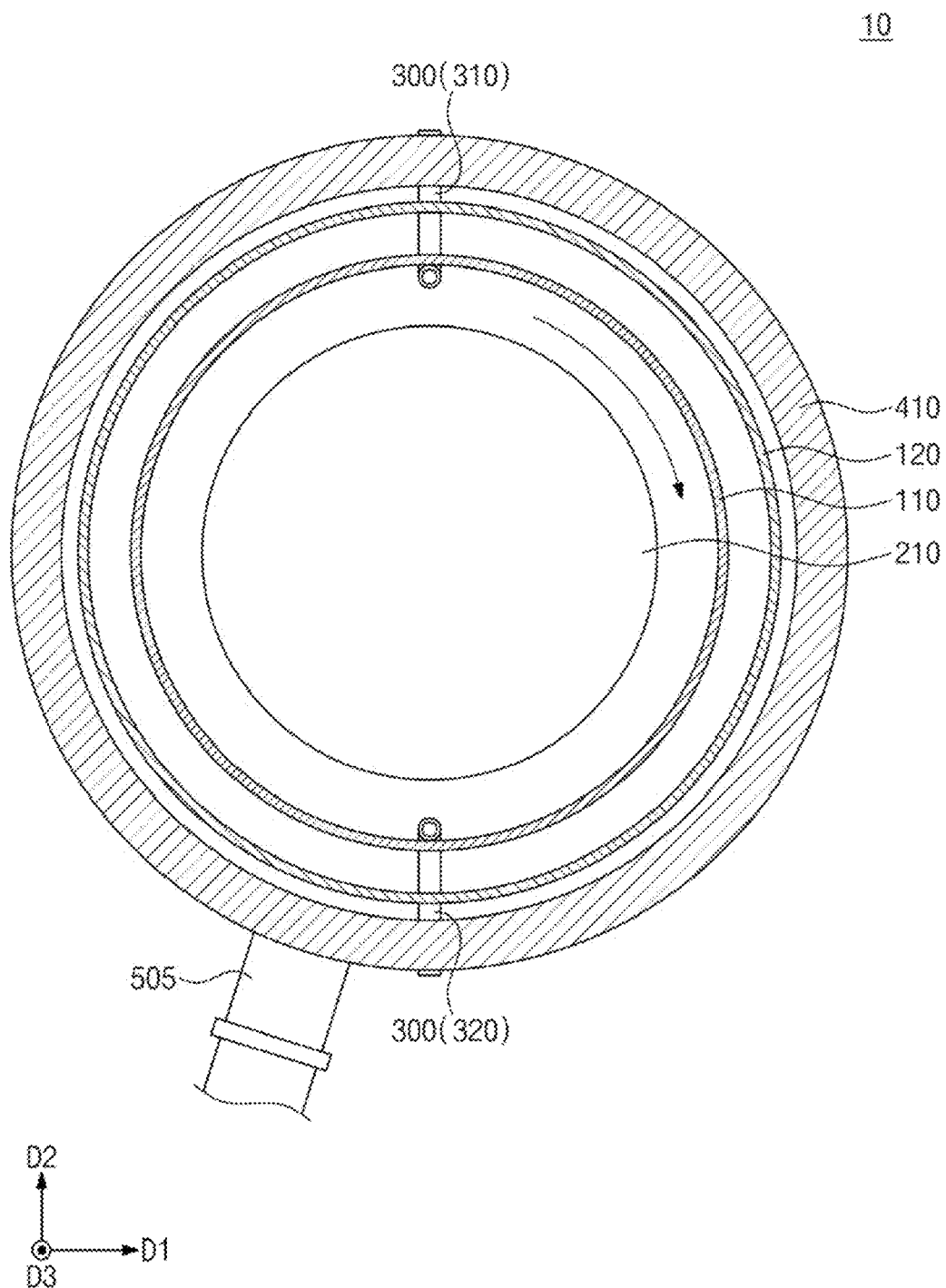
FIG. 2 is a plan view of the apparatus for depositing a thin layer in FIG. 1.
Figure 3:
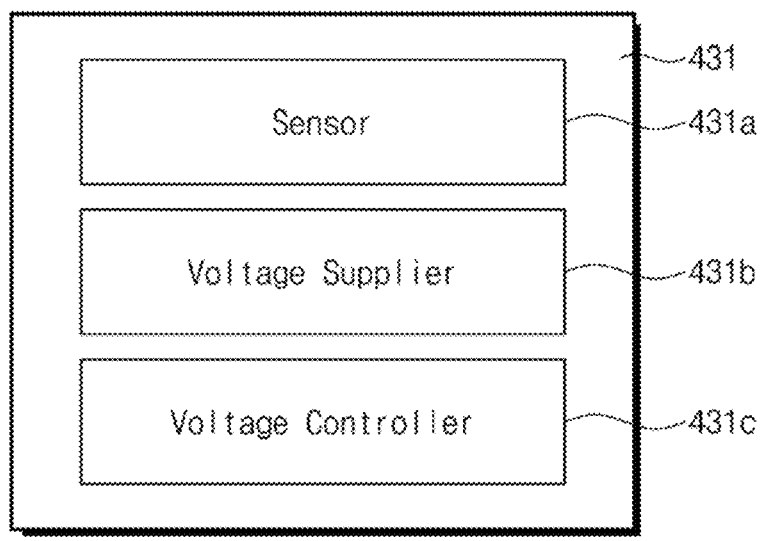
FIG. 3 is a conceptual diagram of some components of the apparatus for depositing a thin layer in FIG. 1.

FIG. 1 is a schematic view of an apparatus for depositing a thin layer, according to some embodiments. FIG. 2 is a plan view of the apparatus for depositing a thin layer in FIG. 1. FIG. 3 is a conceptual diagram of some components of the apparatus for depositing a thin layer in FIG. 1.

Referring to FIGS. 1 and 2, an apparatus 10 for depositing a thin layer according to some embodiments may be used to deposit a thin layer on a substrate SUB by supplying gases into the apparatus 10 and reacting the gases with each other in the apparatus 10. The substrate SUB may be used to manufacture a semiconductor device and may be, e.g., a semiconductor substrate. The apparatus 10 for depositing a thin layer may be a low-pressure chemical vapor deposition (LPCVD) apparatus. In an implementation, the apparatus 10 for depositing a thin layer may be driven under a pressure condition of 1 Pa to 300 Pa.

The apparatus 10 for depositing a thin layer may include a process chamber 100, a support 200, a gas injector 300, a heater 400, a gas exhauster 500, a gas supply 550, and an elevator 600.

The process chamber 100 may have an inner space in which a process of depositing a thin layer is performed. In an implementation, the substrates SUB may be provided in the process chamber 100, and a thin layer may be deposited on the substrates SUB by injecting gases. The process chamber 100 may have a sealed structure to maintain a low pressure, e.g., close to a vacuum state. The process chamber 100 may be made of a material having excellent heat resistance. In an implementation, the process chamber 100 may be made of a material having excellent corrosion resistance to gases supplied therein. In an implementation, the process chamber 100 may include, e.g., yttrium oxide ($Y_2O_3$).

The process chamber 100 may include an inner tube 110 and an outer tube 120. The inner tube 110 may have a cylindrical shape of which top and bottom ends are opened (e.g., a hollow cylindrical shape). The inner tube 110 may have a ring shape when viewed in a plan view (see FIG. 2). The outer tube 120 may surround the inner tube 110. In an implementation, the outer tube 120 may have a cylindrical pipe shape having a closed top end. A bottom end of the outer tube 120 may be open.

The gas exhauster 500 may exhaust gases in the process chamber 100 to the outside. The gas exhauster 500 may help reduce a pressure in the process chamber 100. The gas exhauster 500 may help maintain a constant pressure in the process chamber 100. The gas exhauster 500 may include an exhaust port 505 connected to the process chamber 100, and a vacuum pump.

The support 200 may be in the process chamber 100. The support 200 may support the substrates SUB. In an implementation, the support 200 may include a substrate loader 210, a support plate 220, a rotator 230, a seal cap 240, and a slot 250.

The substrate loader 210 may be on the support plate 220. A plurality of the substrates SUB may be loaded in the substrate loader 210 in a third direction D3. The slot 250 may be on the substrate loader 210. The slot 250 may include a plurality of grooves for receiving the substrates SUB. By way of the slot 250, the plurality of substrates SUB may be loaded at different heights in the process chamber 100. The substrate loader 210 may be loaded into or unloaded from the process chamber 100 by the elevator 600. In an implementation, the substrate loader 210 may be loaded into or unloaded from the inner tube 110 by the elevator 600.

The support plate 220 may support the substrate loader 210. The support plate 220 may be on the seal cap 240. The support plate 220 may be loaded into or unloaded from the process chamber 100.

The seal cap 240 may be under the process chamber 100. In an implementation, the seal cap 240 may seal the open bottom end of the outer tube 120. The seal cap 240 may be moved in the third direction D3 by the elevator 600. In an implementation, the seal cap 240 may be moved in up and down directions.

A seal may be at a contact portion of the seal cap 240 and the outer tube 120. The seal may be, e.g., an O-ring. The seal may help prevent a gas from leaking between the process chamber 100 and the seal cap 240.

The rotator 230 may be configured to rotate the substrate loader 210. In an implementation, the rotator 230 may rotate the seal cap 240 and/or the support plate 220 to rotate the substrate loader 210. The rotator 230 may include a rotation motor. The rotator 230 may be under the seal cap 240.

The gas injector 300 may be in the process chamber 100. The gas injector 300 may be connected to the gas supply 550 through a supply line. The gas supply 550 may be configured to supply a plurality of process gases into the gas injector 300 through the supply line. In an implementation, the process gases may include a source gas, a reaction gas, or a cleaning gas. The gas injector 300 may inject the process gases into the process chamber 100 in various ways. As used herein, the term "or" is not an exclusive term, e.g., "A or B" would include A, B, or A and B.

The gas injector 300 may include a first injector 310 and a second injector 320. The first injector 310 may be configured to inject a first gas SG1 into the process chamber 100. The first injector 310 may inject the first gas SG1 in a direction (e.g., the third direction D3) from a lower portion toward an upper portion of the process chamber 100. The second injector 320 may be configured to inject a second gas SG2 into the process chamber 100. The second injector 320 may inject the second gas SG2 in the direction from the lower portion toward the upper portion of the process chamber 100. In an implementation, the gas injector 300 may further include an injection controller. The injection controller may control flow rates of the first and second gases SG1 and SG2 injected from the first and second injectors 310 and 320.

The first gas SG1 and the second gas SG2 may react with each other to deposit a thin layer on the substrate SUB. In an implementation, the first gas SG1 and the second gas SG2 may be referred to as a first source gas SG1 and a second source gas SG2, respectively. In an implementation, the first gas SG1 may include, e.g., dichlorosilane ($SiH_2Cl_2$) or hexachlorodisilane (HCDS). In an implementation, the second gas SG2 may include, e.g., ammonia ($NH_3$) or nitrogen ($N_2$). In an implementation, the first gas SG1 may include, e.g., dichlorosilane ($SiH_2Cl_2$), and the second gas SG2 may include, e.g., ammonia ($NH_3$). In this case, the thin layer may include, e.g., silicon nitride ($Si_3N_4$).

In an implementation, a ratio of the flow rate of the first gas SG1 to the flow rate of the second gas SG2 may range from, e.g., 1:9.5 to 1:10.5. In an implementation, the first gas SG1 and the second gas SG2 may be injected into the process chamber 100 at the flow rate ratio of about 1:10. In an implementation, the first gas SG1 may be injected into the process chamber 100 at a flow rate of 10 sccm, and the second gas SG2 may be injected into the process chamber 100 at a flow rate of 100 sccm. In an implementation, the first gas SG1 may be injected into the process chamber 100 at a flow rate of 1,000 sccm, and the second gas SG2 may be injected into the process chamber 100 at a flow rate of 10,000 sccm. In an implementation, the first gas SG1 may be injected into the process chamber 100 at a flow rate of, e.g., 10 sccm to 1,000 sccm, and the second gas SG2 may be injected into the process chamber 100 at a flow rate of, e.g., 100 sccm to 10,000 sccm. In an implementation, the first gas SG1 may be injected into the process chamber 100 at a flow rate of, e.g., 120 sccm to 240 sccm, and the second gas SG2 may be injected into the process chamber 100 at a flow rate of, e.g., 1,200 sccm to 2,400 sccm.

In an implementation, a height H1 (e.g., in the third direction D3) of the process chamber 100 may range from, e.g., 50 cm to 200 cm. In an implementation, the height H1 of the process chamber 100 may range from, e.g., 133.7 cm to 151.0 cm. For example, the height H1 of the process chamber 100 may be defined as a vertical length from a top of the inner space to a bottom of the inner tube 110. As the height H1 of the process chamber 100 increases, the flow rates of the first and second gases SG1 and SG2 injected into the process chamber 100 may also increase. Thus, it is possible to compensate for a flow rate difference, which could otherwise occur when the first and second gases SG1 and SG2 are injected in the direction from the lower portion toward the upper portion of the process chamber 100. In an implementation, when the height H1 of the process chamber 100 is 133.7 cm, the flow rate of the first gas SG1 may range from, e.g., 120 sccm to 160 sccm, and the flow rate of the second gas SG2 may range from 1,200 sccm to 1,600 sccm. In an implementation, when the height H1 of the process chamber 100 is 151.0 cm, the flow rate of the first gas SG1 may range from, e.g., 160 sccm to 240 sccm, and the flow rate of the second gas SG2 may range from, e.g., 1,600 sccm to 2,400 sccm. In an implementation, a ratio of the flow rate of the first gas SG1 to the height H1 of the process chamber 100 may range from 0.895 sccm/cm to 1.590 sccm/cm.

The flow rates of the first and second gases SG1 and SG2 injected into the process chamber 100 may be relatively great as compared with typical flow rates. In an implementation, the first and second gases SG1 and SG2 may be injected into the process chamber 100 at relatively high rates. Thus, deposition rates of the thin layers formed on the substrates SUB at different heights may be relatively uniform. This will be described below in detail.

The first injector 310 may face the second injector 320. The first injector 310 and the second injector 320 may be spaced apart from each other in a second direction D2. The first injector 310 and the second injector 320 may be at opposite positions to each other. In an implementation, the first injector 310 and the second injector 320 may be at positions adjacent to the support 200. One of the first injector 310 and the second injector 320 may be at a position adjacent to the exhaust port 505.

The heater 400 may surround the process chamber 100. The heater 400 may be configured to heat the process chamber 100. Each of the heater 400 and the process chamber 100 may include a first temperature region TR1, a second temperature region TR2, a third temperature region TR3, a fourth temperature region TR4, and a fifth temperature region TR5. The first to fifth temperature regions TR1 to TR5 may be sequentially stacked in a direction (e.g., the third direction D3) from a lower portion toward an upper portion of each of the heater 400 and the process chamber 100. In an implementation, the first temperature region TR1 may be at a lowermost position, the third temperature region TR3 may be at a middle position, and the fifth temperature region TR5 may be at an uppermost position.

The heater 400 may include a body 410, coils 420, a first temperature controller 431, a second temperature controller 432, a third temperature controller 433, a fourth temperature controller 434, and a fifth temperature controller 435.

The body 410 of the heater 400 may surround the process chamber 100. In an implementation, the body 410 may have a cylindrical pipe shape having a closed top end. A bottom end of the body 410 may be opened.

The coils 420 and the first to fifth temperature controllers 431 to 435 may be on an inner sidewall of the body 410. A plurality of the coils 420 may be on the inner sidewall of the body 410. The coils 420 may be (e.g., independently) supplied with voltages from the first to fifth temperature controllers 431 to 435 to emit heat (e.g., by joule heating), thereby heating the process chamber 100. The coils 420 may face an outer sidewall of the outer tube 120. Each of the coils 420 may be provided in a corresponding one of the first to fifth temperature regions TR1 to TR5.

The first to fifth temperature controllers 431 to 435 may be on the inner sidewall of the body 410. Each of the first to fifth temperature controllers 431 to 435 may be provided between the coils 420 adjacent to each other. The first to fifth temperature controllers 431 to 435 may be in the first to fifth temperature regions TR1 to TR5, respectively. In an implementation, the first temperature controller 431 may be in the first temperature region TR1, and the fifth temperature controller 435 may be in the fifth temperature region TR5. Each of the first to fifth temperature controllers 431 to 435 may be configured to independently sense a temperature of (e.g., a corresponding temperature region of) the process chamber 100 and may be configured to independently supply a voltage to the coils 420 to control the temperature. The first to fifth temperature controllers 431 to 435 will be described in more detail with reference to FIG. 3.

Referring to FIGS. 1, 2 and 3, the first temperature controller 431 may include a sensor 431a, a voltage supplier 431b, and a voltage controller 431c. FIG. 3 illustrates only the first temperature controller 431. It may be understood that each of the second to fifth temperature controllers 432 to 435 may also include a sensor, a voltage supplier, and a voltage controller.

The sensor 431a may be configured to sense a temperature of the process chamber 100. The sensor of each of the first to fifth temperature controllers 431 to 435 may sense a temperature of a corresponding one of the first to fifth temperature regions TR1 to TR5. In an implementation, the sensor 431a of the first temperature controller 431 may be configured to sense a temperature in the first temperature region TR1.

The voltage supplier 431b may be configured to supply a voltage to the coils 420. The voltage supplier 431b may be configured to supply a voltage (e.g., only) to the coils 420 in the first temperature region TR1. In an implementation, the voltage supplier of each of the first to fifth temperature controllers 431 to 435 may be configured to independently supply a voltage to the coils 420 in a corresponding one of the first to fifth temperature regions TR1 to TR5. The coils 420 may be supplied with the voltage from the voltage supplier to emit heat, thereby heating the corresponding region of the process chamber 100.

The voltage controller 431c may be configured to control the voltage supplied to the corresponding coils 420. The voltage controller 431c (e.g., of the first temperature controller 431) may be configured to control the voltage supplied (e.g., only) to the coils 420 in the first temperature region TR1. In an implementation, the voltage controller of each of the first to fifth temperature controllers 431 to 435 may be configured to independently control the voltage supplied to the coils 420 in a corresponding one of the first to fifth temperature regions TR1 to TR5. In an implementation, when a temperature of the first temperature region TR1 sensed by the sensor 431a is lower than a preset reference temperature (e.g., 730° C.), the voltage controller 431c may increase the voltage supplied to the coils 420 of the first temperature region TR1 by the voltage supplier 431b. In an implementation, when a temperature of the first temperature region TR1 sensed by the sensor 431a is higher than the preset reference temperature (e.g., 730° C.), the voltage controller 431c may decrease the voltage supplied to the coils 420 of the first temperature region TR1 by the voltage supplier 431b.

Temperatures of the first to fifth temperature regions TR1 to TR5 may be different from each other. In an implementation, a temperature in the process chamber 100 may progressively increase from the first temperature region TR1 toward the fifth temperature region TR5. The first and second gases SG1 and SG2 may be injected (e.g., and may flow) in the direction from the lower portion toward the upper portion of the process chamber 100, the flow rates of the first and second gases SG1 and SG2 may be reduced in the upper portion of the process chamber 100. To maintain uniformity of the deposition rates of the thin layers by compensating for this difference in flow rates, a temperature in the upper portion of the process chamber 100 may be increased to be higher than a temperature in the lower portion of the process chamber 100.

A ratio of the temperature in the first temperature region TR1 to the temperature in the fifth temperature region TR5 in degrees Celsius may range from, e.g., 1:1.0001 to 1:2.05. In an implementation, the ratio of the temperature in the first temperature region TR1 to the temperature in the fifth temperature region TR5 in degrees Celsius may range from, e.g., 1:1.01 to 1:1.03. In an implementation, the temperature in the first temperature region TR1 may range from, e.g., 490° C. to 739.95° C. In an implementation, the temperature in the fifth temperature region TR5 may range from, e.g., 740.05° C. to 1,000° C. In an implementation, the temperature in the first temperature region TR1 may range from, e.g., 730° C. to 734° C., and the temperature in the fifth temperature region TR5 may range from, e.g., 746° C. to 750° C. In an implementation, when the temperature in the first temperature region TR1 increases, the temperature in the fifth temperature region TR5 may decrease. In an implementation, the temperature in the fifth temperature region TR5 may be 1,000° C. when the temperature in the first temperature region TR1 is 490° C., and the temperature in the fifth temperature region TR5 may be 740.05° C. when the temperature in the first temperature region TR1 is 739.95° C. In an implementation, a difference between the temperature in the first temperature region TR1 and the temperature in the fifth temperature region TR5 may range from 0.1° C. to 510° C. In an implementation, the temperature in the fifth temperature region TR5 may be 750° C. when the temperature in the first temperature region TR1 is 730° C., and the temperature in the fifth temperature region TR5 may be 746° C. when the temperature in the first temperature region TR1 is 734° C. In an implementation, the difference between the temperature in the first temperature region TR1 and the temperature in the fifth temperature region TR5 may range from, e.g., 12° C. to 20° C. In an implementation, a temperature in the third temperature region TR3 may be, e.g., 740° C.

The difference between the temperature in the first temperature region TR1 and the temperature in the fifth temperature region TR5 may be adjusted depending on the flow rates of the first and second gases SG1 and SG2 injected from the first and second injectors 310 and 320, respectively. In an implementation, when the flow rate of the first gas SG1 injected from the first injector 310 is 120 sccm and the flow rate of the second gas SG2 injected from the second injector 320 is 1,200 sccm, the temperature in the first temperature region TR1 may be 730° C. and the temperature in the fifth temperature region TR5 may be 750° C. In an implementation, when the flow rate of the first gas SG1 injected from the first injector 310 is 240 sccm and the flow rate of the second gas SG2 injected from the second injector 320 is 2,400 sccm, the temperature in the first temperature region TR1 may be 734° C. and the temperature in the fifth temperature region TR5 may be 746° C. A ratio of the difference between the temperatures in the first and fifth temperature regions TR1 and TR5 to the flow rate of the first gas SG1 may range from, e.g., 1/20° C./sccm to 1/6° C./sccm.

This may be because the deposition rates of the thin layers become relatively uniform as the flow rates of the first and second gases SG1 and SG2 increase, thereby reducing the temperature difference between the upper portion and the lower portion of the process chamber 100. In an implementation, the flow rates of the first and second gases SG1 and SG2 may be increased as compared with typical flow rates, and a temperature dispersion or difference in the process chamber 100 may be reduced and the highest temperature in the process chamber 100 may be reduced to 750° C. or less. As a result, a propagation delay time (tPD) dispersion of a semiconductor device manufactured in the apparatus 10 for depositing a thin layer may be reduced to help improve reliability and electrical characteristics of the semiconductor device. This will be described below in detail.

Figure 4A:
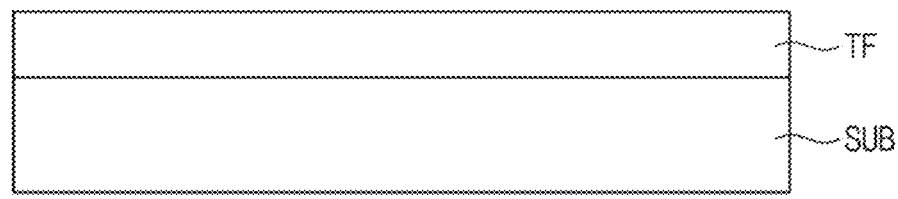
FIG. 4A is a cross-sectional view of a thin layer deposited in an apparatus for depositing a thin layer, according to some embodiments.
Figure 4B:
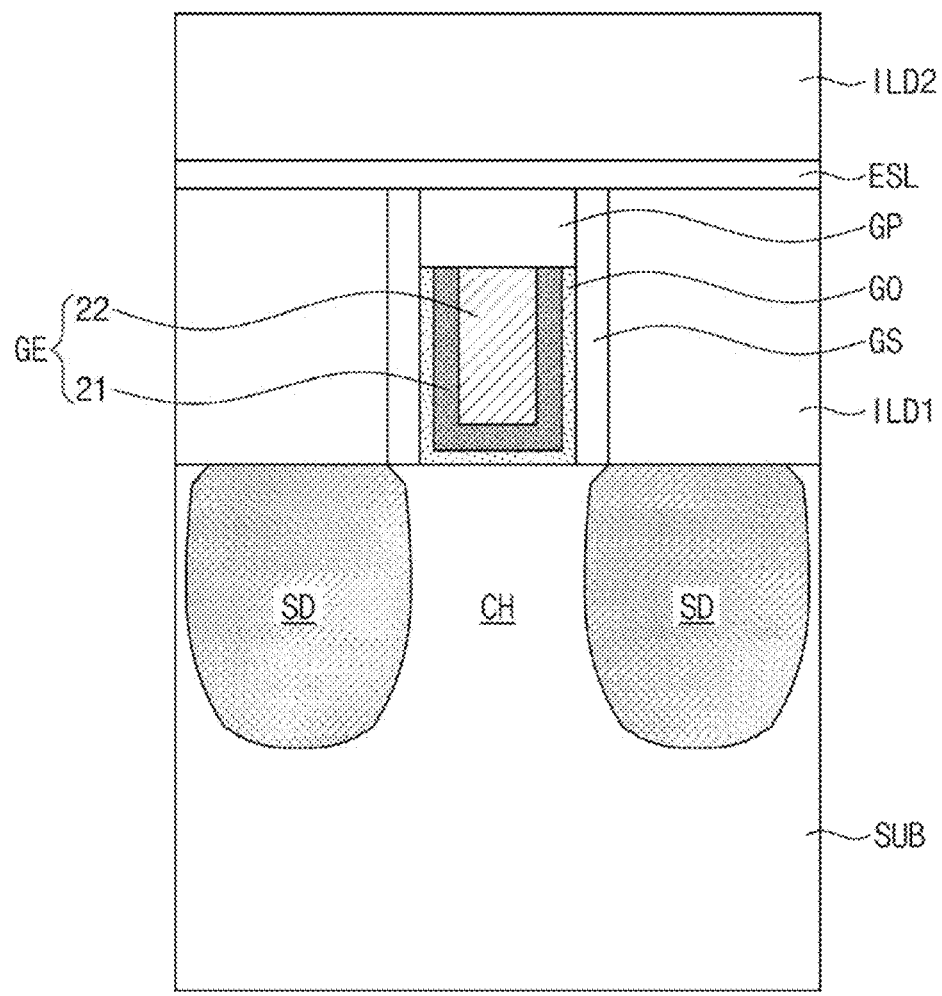
FIG. 4B is a cross-sectional view of a semiconductor device manufactured in an apparatus for depositing a thin layer, according to some embodiments.

FIG. 4A is a cross-sectional view of a thin layer deposited in an apparatus for depositing a thin layer, according to some embodiments. FIG. 4B is a cross-sectional view of a semiconductor device manufactured in an apparatus for depositing a thin layer, according to some embodiments.

Referring to FIG. 4A, a thin layer TF may be deposited on a substrate SUB. The thin layer TF may include, e.g., silicon nitride ($Si_3N_4$). In the present embodiments, the thin layer TF may also be referred to as a silicon nitride layer. The thin layer TF may be used as, e.g., a gate capping pattern, a gate spacer, or an etch stop layer in a semiconductor device.

According to some embodiments, a composition ratio of silicon nitride included in the thin layers deposited on the substrates SUB located at different heights may be relatively uniform by increasing the flow rates of the first and second gases injected into the process chamber. This may be because the deposition rates of the thin layers become more uniform as the flow rates of the first and second gases increase.

Referring to FIG. 4B, a semiconductor device may be manufactured in the apparatus for depositing a thin layer according to the embodiments. The semiconductor device may include a pair of source/drain patterns SD in an upper portion of a substrate SUB, a channel pattern CH between the pair of source/drain patterns SD, a gate oxide layer GO on the channel pattern CH, a gate electrode GE on the gate oxide layer GO, a gate capping pattern GP on the gate electrode GE, and a gate spacer GS on a sidewall of the gate electrode GE. The semiconductor device may further include a first interlayer insulating layer ILD1 covering the gate capping pattern GP and the gate spacer GS, an etch stop layer ESL on the first interlayer insulating layer ILD1, and a second interlayer insulating layer ILD2 on the etch stop layer ESL.

The source/drain patterns SD may include P-type dopants. In an implementation, the source/drain patterns SD may include boron (B). The gate electrode GE may include a poly-silicon layer 21 and a metal layer 22 on the poly-silicon layer 21. In an implementation, the metal layer 22 may include tungsten (W). Each of the gate capping pattern GP and the gate spacer GS may include silicon nitride. Each of the gate capping pattern GP and the etch stop layer ESL may be formed by depositing a silicon nitride layer after formation of the source/drain patterns SD.

In the apparatus for depositing a thin layer according to the embodiments, the first gas and the second gas may react with each other to form the silicon nitride layer for each of the gate capping pattern GP and the etch stop layer ESL.

According to the embodiments, composition ratios of the thin layers deposited on the substrates SUB located at different heights may become relatively uniform by increasing the flow rates of the first and second gases injected into the process chamber. In an implementation, the composition ratios of the silicon nitride ($Si_xN_y$) layers may be relatively uniform, and etch rates in a subsequent etching process may also become relatively uniform to improve reliability of the semiconductor device.

In an implementation, by increasing the flow rates of the first and second gases, the temperature difference between the upper and lower portions of the process chamber may be reduced, and the highest temperature in the process chamber may be reduced to 750° C. or less. Thus, activation of boron (B) ions of the source/drain patterns SD may be prevented to help prevent a channel length of the semiconductor device from being shortened. Boron (B) ions may be activated at a high temperature, e.g., higher than 750° C.

In other methods, a channel length of a semiconductor device manufactured in an upper portion of a process chamber (to which a relatively high temperature is applied) could be shortened by diffusion of boron (B) ions to cause a phenomenon that the semiconductor device operates in a standby state. In other words, a propagation delay time (tPD) of the semiconductor device may be reduced. On the contrary, a propagation delay time (tPD) of a semiconductor device manufactured in a lower portion of the process chamber (to which a relatively low temperature is applied) may be increased to cause reduction in operation speed of the semiconductor device. In other words, the propagation delay time (tPD) of the semiconductor device may be increased. Thus, it may be important to reduce a temperature dispersion or gradient in the process chamber in a process of depositing a thin layer.

In the apparatus for depositing a thin layer according to the embodiments, the temperature dispersion or gradient in or between the upper and lower portions of the process chamber may be reduced by increasing the flow rates of the first and second gases injected into the process chamber. Thus, a propagation delay time dispersion of semiconductor devices manufactured therein may also be reduced. As a result, according to the embodiments, electrical characteristics of the semiconductor device may be improved.

Figure 5:
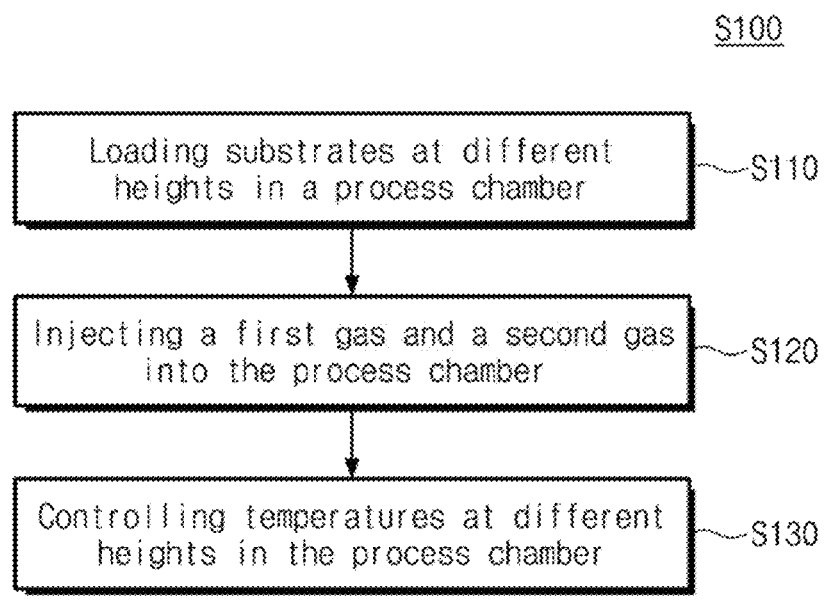
FIG. 5 is a flowchart of a method of depositing a thin layer, according to some embodiments.
Figure 6:
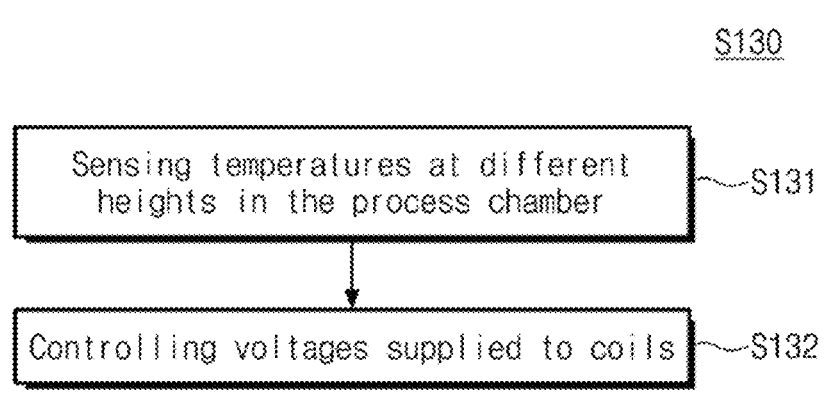
FIG. 6 is a flowchart of a method of depositing a thin layer, according to some embodiments.

FIG. 5 is a flowchart of a method of depositing a thin layer, according to some embodiments. FIG. 6 is a flowchart of a method of depositing a thin layer, according to some embodiments. A method of depositing a thin layer will be described with reference to also FIGS. 1 to 3.

Referring to FIGS. 1 to 3 and 5, a step S100 of depositing a thin layer according to some embodiments may include loading substrates SUB at different heights in the process chamber 100 (S110). Edges of the substrates SUB may be in the grooves of the slot 250, respectively. The substrates SUB may be loaded (e.g., stacked) in the third direction D3.

Thereafter, a thin layer may be deposited on each of the substrates SUB by injecting a first gas SG1 and a second gas SG2 into the process chamber 100 (S120). The first injector 310 may inject the first gas SG1 into the process chamber 100. The second injector 320 may inject the second gas SG2 into the process chamber 100.

The first gas SG1 and the second gas SG2 may react with each other to deposit thin layers TF on the substrates SUB, respectively, like FIG. 4A. In an implementation, the first gas SG1 may include dichlorosilane, and the second gas SG2 may include ammonia. The thin layer may include silicon nitride ($Si_3N_4$).

A flow rate of the first gas SG1 injected from the first injector 310 may range from 120 sccm to 240 sccm. A flow rate of the second gas SG2 injected from the second injector 320 may range from 1,200 sccm to 2,400 sccm. A ratio of the flow rate of the first gas SG1 to the flow rate of the second gas SG2 may range from 1:9.5 to 1:10.5. In an implementation, the first gas SG1 and the second gas SG2 may be injected into the process chamber 100 at the flow rate ratio of about 1:10.

After injecting the first gas SG1 and the second gas SG2, temperatures at different heights (e.g., different temperature regions) in the process chamber 100 may be independently controlled (S130). The controlling of the temperatures at the different heights (S130) may include sensing temperatures at the different heights in the process chamber 100 (S131) and controlling voltages supplied to the coils 420 (S132), as illustrated in FIG. 6.

The sensor 431a may sense the temperature in the corresponding region of the process chamber 100 (S131). In an implementation, the sensor of each of the first to fifth temperature controllers 431 to 435 may independently sense the temperature of a corresponding one of the first to fifth temperature regions TR1 to TR5.

The voltage supplier 431b may supply the voltage to the coils 420. The voltage supplier 431b may supply the voltage to the coils 420 in the first temperature region TR1. In an implementation, the voltage supplier of each of the first to fifth temperature controllers 431 to 435 may independently supply the voltage to the coils 420 in a corresponding one of the first to fifth temperature regions TR1 to TR5. The coils 420 may be supplied with the voltage from the voltage supplier to emit heat.

The voltage controller 431c may control the voltage supplied to the coils 420 (S132). The voltage controller 431c may control the voltage supplied to the coils 420 in the first temperature region TR1. In an implementation, the voltage controller of each of the first to fifth temperature controllers 431 to 435 may independently control the voltage supplied to the coils 420 provided in a corresponding one of the first to fifth temperature regions TR1 to TR5.

A ratio of the temperature in the first temperature region TR1 to the temperature in the fifth temperature region TR5 in degrees Celsius may range from, e.g., 1:1.01 to 1:1.03. The temperature in the first temperature region TR1 may range from 730° C. to 734° C. The temperature in the fifth temperature region TR5 may range from 746° C. to 750° C. A difference between the temperature in the first temperature region TR1 and the temperature in the fifth temperature region TR5 may range from 12° C. to 20° C. The temperature in the third temperature region TR3 may be 740° C.

The difference between the temperature in the first temperature region TR1 and the temperature in the fifth temperature region TR5 may be adjusted depending on the flow rates of the first and second gases SG1 and SG2 injected from the first and second injectors 310 and 320, respectively. A ratio of the difference between the temperatures in the first and fifth temperature regions TR1 and TR5 to the flow rate of the first gas SG1 may range from $1/20°$ C./sccm to $1/6°$ C./sccm.

Subsequent processes may be performed after the controlling of the temperatures at the different heights in the process chamber (S130). Finally, a semiconductor device may be manufactured.

Figure 7:
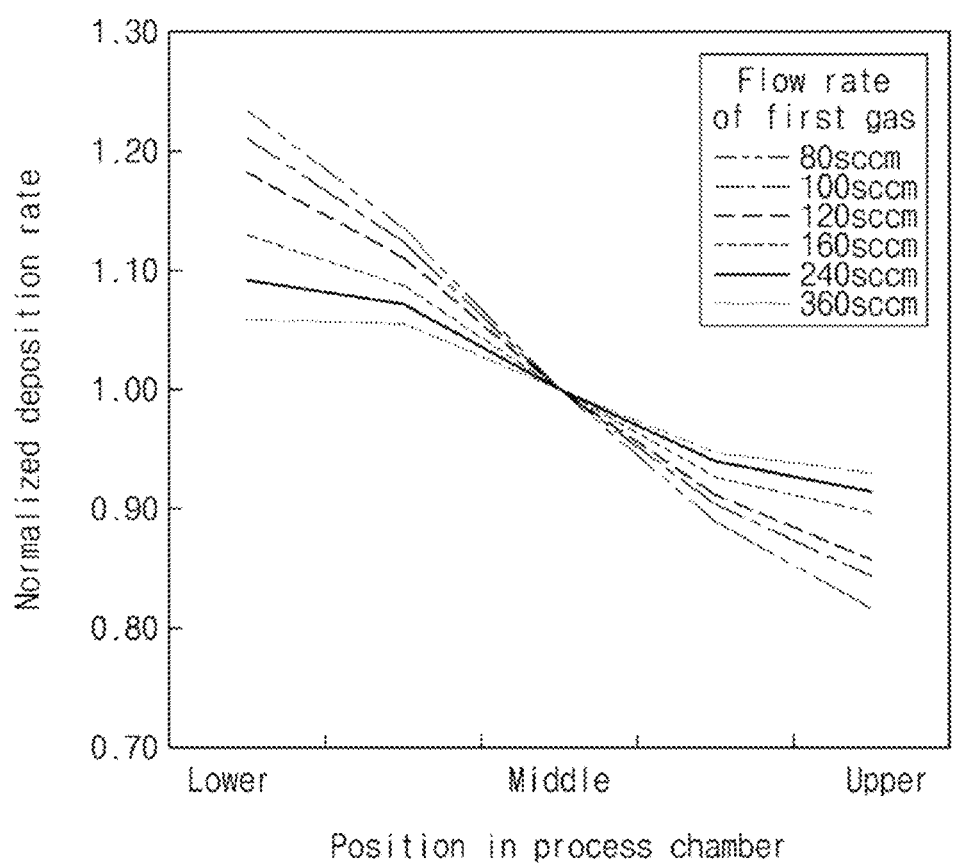
FIG. 7 is a graph showing a deposition rate of a thin layer according to a flow rate of a first gas and a position in a process chamber in an apparatus for depositing a thin layer, according to some embodiments.
Figure 8:
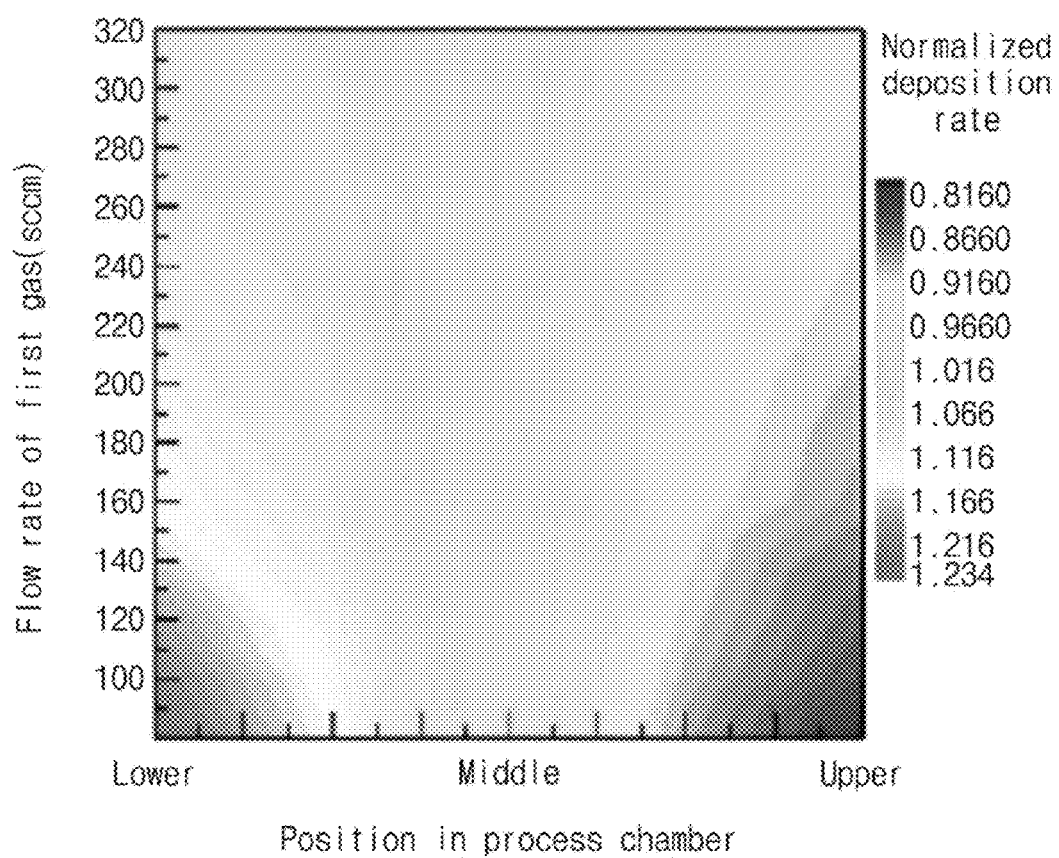
FIG. 8 is a graph showing a deposition rate of a thin layer according to a flow rate of a first gas and a position in a process chamber in an apparatus for depositing a thin layer, according to some embodiments.

FIG. 7 is a graph showing a deposition rate of a thin layer according to a flow rate of a first gas and a position in a process chamber in an apparatus for depositing a thin layer, according to some embodiments. FIG. 8 is a graph showing a deposition rate of a thin layer according to a flow rate of a first gas and a position in a process chamber in an apparatus for depositing a thin layer, according to some embodiments. Here, the first gas and the second gas are injected at a flow rate ratio of 1:10, and a normalized deposition rate means a relative deposition rate when a deposition rate in a middle portion of the process chamber is set to 1.

Referring to FIGS. 7 and 8, it may be seen that deposition rates of thin layers in the process chamber become more uniform as the flow rates of the first and second gases increase. Here, it may be seen that the deposition rates rapidly become uniform after the flow rate of the first gas reaches 120 sccm, and it may be seen that the degree to which the deposition rates become uniform is significantly reduced when the flow rate of the first gas is greater than 240 sccm.

Figure 9:
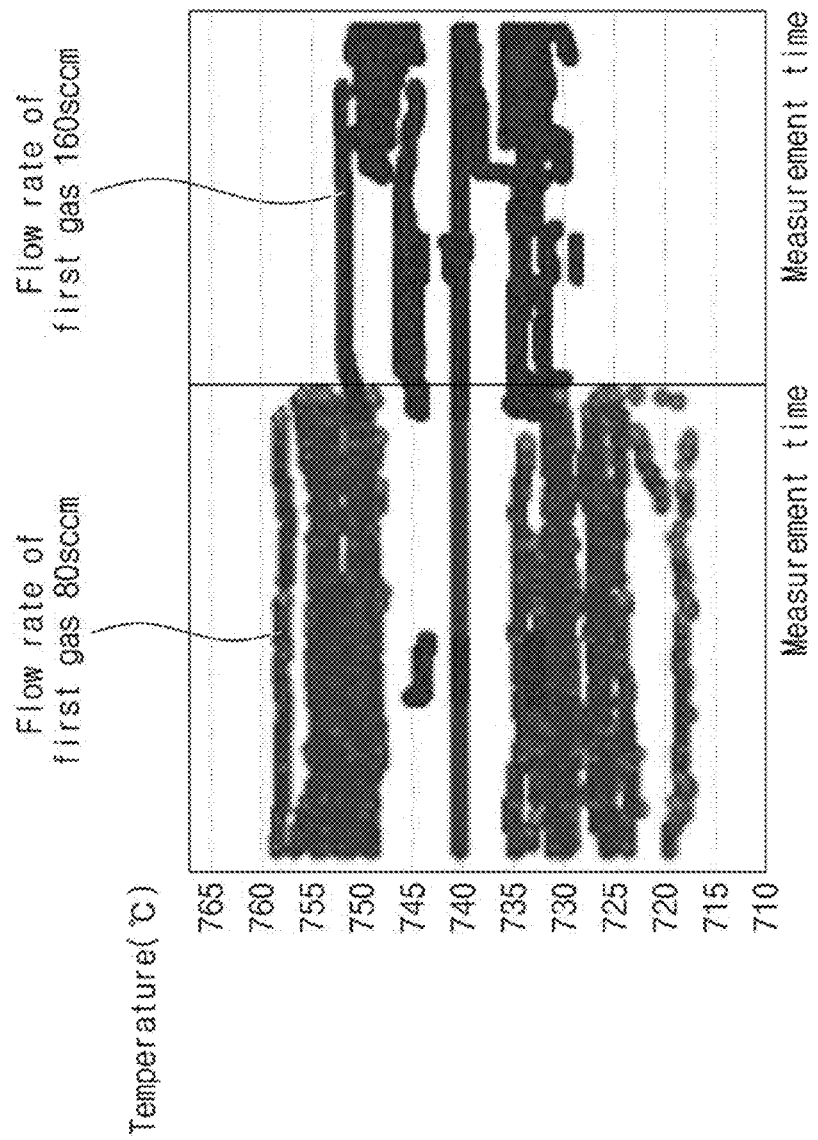
FIG. 9 is a graph showing a temperature dispersion in a process chamber according to a flow rate of a first gas in an apparatus for depositing a thin layer, according to some embodiments.

FIG. 9 is a graph showing a temperature dispersion in a process chamber according to a flow rate of a first gas in an apparatus for depositing a thin layer, according to some embodiments. Here, the first gas and the second gas are injected at a flow rate ratio of 1:10. Each point represents a temperature in the process chamber according to a measurement time.

Referring to FIG. 9, it may be seen that a temperature dispersion in the process chamber when the flow rate of the first gas is 160 sccm is significantly reduced, as compared with a temperature dispersion in the process chamber when the flow rate of the first gas is 80 sccm. A difference between maximum and minimum temperatures in the process chamber when the flow rate of the first gas was 160 sccm was reduced by about 46%, as compared with a difference between maximum and minimum temperatures in the process chamber when the flow rate of the first gas was 80 sccm.

Figure 10:
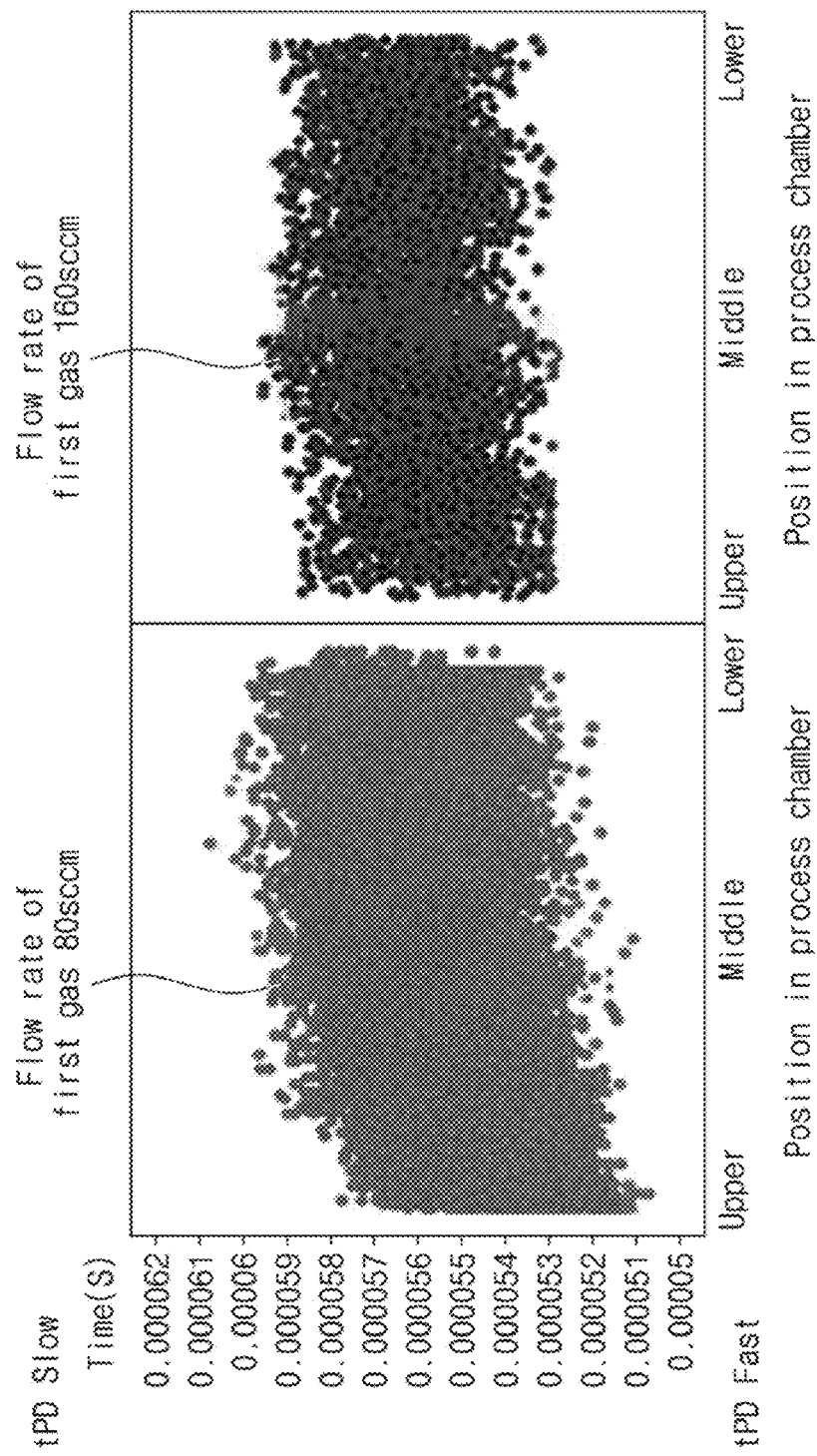
FIG. 10 is a graph showing a propagation delay time (tPD) dispersion of a semiconductor device according to a flow rate of a first gas and a position in a process chamber in an apparatus for depositing a thin layer, according to some embodiments.

FIG. 10 is a graph showing a propagation delay time (tPD) dispersion of a semiconductor device according to a flow rate of a first gas and a position in a process chamber in an apparatus for depositing a thin layer, according to some embodiments. Each point represents a propagation delay time of a semiconductor device according to a position in the process chamber in a manufacturing process.

Referring to FIG. 10, it may be seen that a propagation delay time dispersion of semiconductor devices manufactured in the process chamber when the flow rate of the first gas is 160 sccm is significantly reduced, as compared with a propagation delay time dispersion of semiconductor devices manufactured in the process chamber when the flow rate of the first gas is 80 sccm. A difference between maximum and minimum propagation delay times when the flow rate of the first gas was 160 sccm was reduced by about 32%, as compared with a difference between maximum and minimum propagation delay times when the flow rate of the first gas was 80 sccm.

The deposition rates of the thin layers may become relatively uniform by the increase in flow rate of the first and second gases injected into the process chamber, the temperature difference between the upper and lower portions of the process chamber may be reduced, and thus the propagation delay time dispersion of the semiconductor devices may also be reduced. As a result, electrical characteristics of the semiconductor device may be improved.

Figure 11:
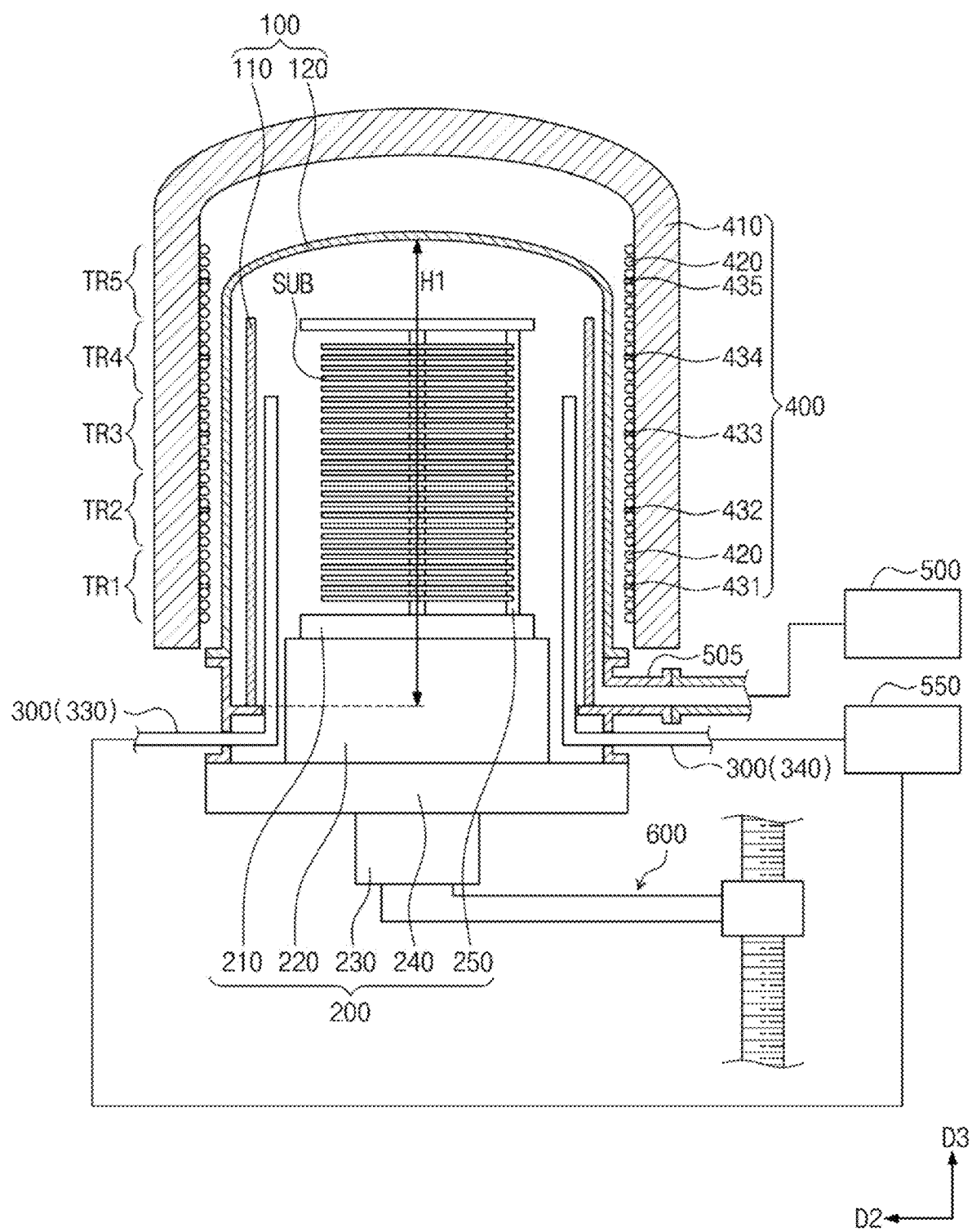
FIG. 11 is a schematic view of an apparatus for depositing a thin layer, according to some embodiments.
Figure 12:
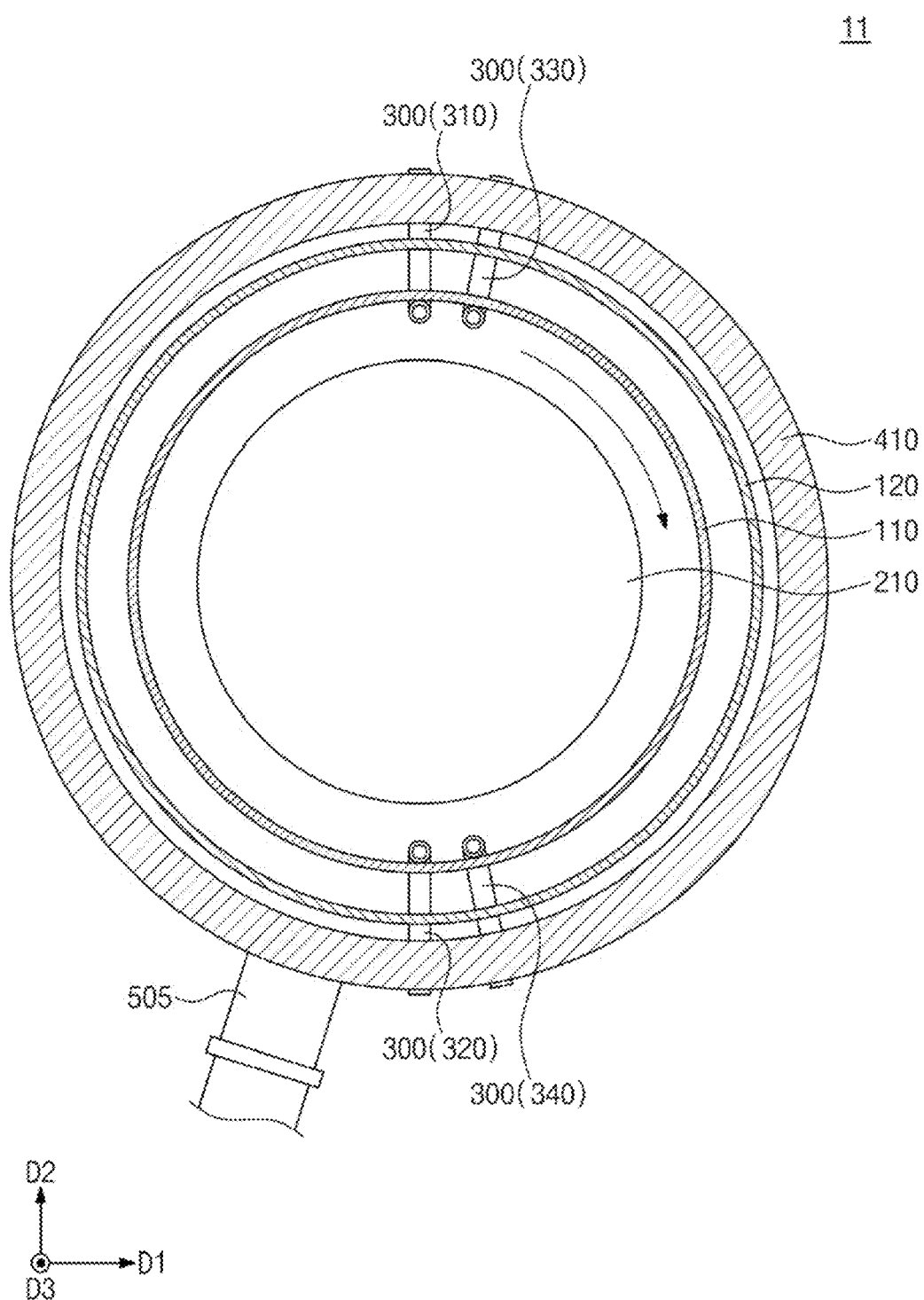
FIG. 12 is a plan view of the apparatus for depositing a thin layer in FIG. 11.
Figure 13:
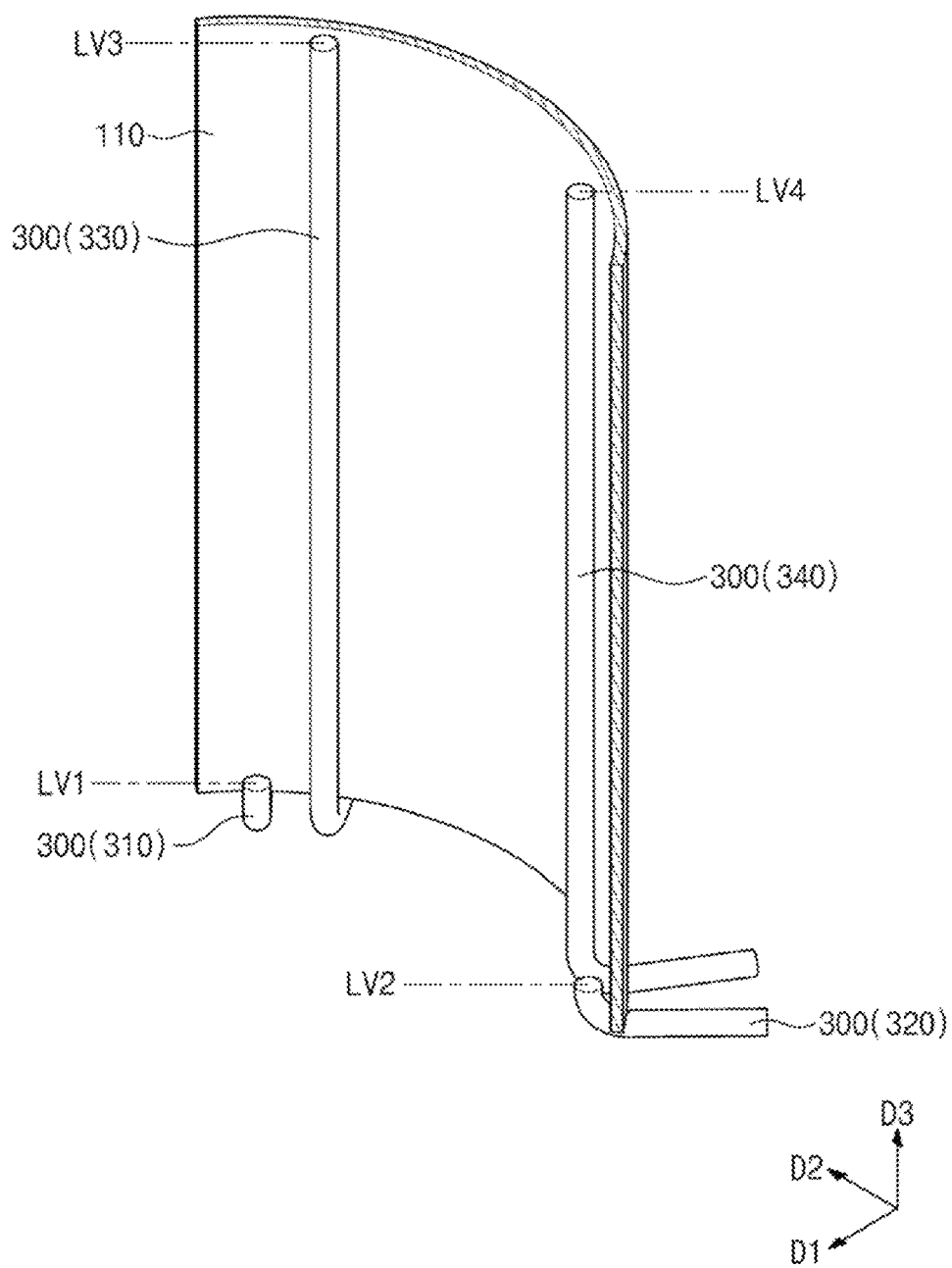
FIG. 13 is a conceptual view of some components of the apparatus for depositing a thin layer in FIG. 11.

FIG. 11 is a schematic view of an apparatus for depositing a thin layer, according to some embodiments. FIG. 12 is a plan view of the apparatus for depositing a thin layer in FIG. 11. FIG. 13 is a conceptual view of some components of the apparatus for depositing a thin layer in FIG. 11. In the present embodiments, the same features and components as in the embodiments of FIGS. 1 to 3 may be omitted for the purpose of ease and convenience in explanation. In other words, differences between the present embodiments and the embodiments of FIGS. 1 to 3 may be mainly described hereinafter.

Referring to FIGS. 11 to 13, a gas injector 300 of an apparatus 11 for depositing a thin layer may include a first injector 310, a second injector 320, a third injector 330, and a fourth injector 340. The third injector 330 may be at a position (e.g., circumferentially) adjacent to the first injector 310. The fourth injector 340 may be at a position (e.g., circumferentially) adjacent to the second injector 320.

The third injector 330 may extend (e.g., upwardly) in a vertical direction in the process chamber 100. In an implementation, the third injector 330 may extend in the third direction D3 in the process chamber 100. The fourth injector 340 may extend in the vertical direction in the process chamber 100. In an implementation, the fourth injector 340 may extend in the third direction D3 in the process chamber 100.

The third injector 330 may be configured to also inject the first gas SG1. In an implementation, the third injector 330 may inject the same gas as the first injector 310. In an implementation, the third injector 330 may inject a gas including dichlorosilane. A flow rate of the first gas SG1 injected from the third injector 330 may be substantially equal to the flow rate of the first gas SG1 injected from the first injector 310. In an implementation, the flow rate of the first gas SG1 injected from the third injector 330 may range from, e.g., 120 sccm to 240 sccm.

The fourth injector 340 may be configured to also inject the second gas SG2. In an implementation, the fourth injector 340 may inject the same gas as the second injector 320. In an implementation, the fourth injector 340 may inject a gas including ammonia. A flow rate of the second gas SG2 injected from the fourth injector 340 may be substantially equal to the flow rate of the second gas SG2 injected from the second injector 320. In an implementation, the flow rate of the second gas SG2 injected from the fourth injector 340 may range from 1,200 sccm to 2,400 sccm.

The highest level of the first injector 310 (e.g., a height in the third direction D3 of an opening in the first injector 310 through which the first gas SG1 is provided into the process chamber 100) may be a first level LV1. The highest level of the second injector 320 may be a second level LV2. The highest level of the third injector 330 may be a third level LV3. The highest level of the fourth injector 340 may be a fourth level LV4.

The third level LV3 may be higher than the first level LV1. In other words, the third injector 330 may inject the first gas SG1 at a position (e.g., in the process chamber 100) higher than that of the first injector 310. In an implementation, the third injector 330 may inject the first gas SG1 in an upper portion of the process chamber 100, and the first injector 310 may inject the first gas SG1 in a lower portion of the process chamber 100.

The fourth level LV4 may be higher than the second level LV2. In other words, the fourth injector 340 may inject the second gas SG2 at a position higher than that of the second injector 320. The fourth injector 340 may inject the second gas SG2 in the upper portion of the process chamber 100, and the second injector 320 may inject the second gas SG2 in the lower portion of the process chamber 100.

The first level LV1 and the second level LV2 may be at substantially the same level. The third level LV3 and the fourth level LV4 may be at substantially the same level.

The third injector 330 and the fourth injector 340 may inject the first gas SG1 and the second gas SG2 in the upper portion of the process chamber 100, respectively. In an implementation, a ratio of the flow rate of the first gas SG1 to the flow rate of the second gas SG2 may be maintained relatively uniformly in the upper portion of the process chamber 100.

The apparatus for depositing a thin layer according to an embodiment may help increase the flow rates of the first and second gases injected into the process chamber to deposit a thin layer. Thus, the deposition rates of thin layers in the process chamber may become relatively uniform to help reduce the temperature difference between the upper and lower portions of the process chamber. As a result, it is possible to help improve reliability and electrical characteristics of semiconductor devices manufactured in the apparatus for depositing a thin layer according to the embodiments.

One or more embodiments may provide an apparatus and a method of depositing a thin layer by injecting gases into a process chamber.

One or more embodiments may provide an apparatus and a method of depositing a thin layer, which are capable of improving deposition characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for depositing a thin layer, the apparatus comprising:
   a process chamber, the process chamber including a first temperature region, a second temperature region, a third temperature region, a fourth temperature region, and a fifth temperature region, which are sequentially arranged in a direction from a lower portion of the process chamber toward an upper portion of the process chamber;
   a support in the process chamber, substrates being supportable on the support at different heights;
   a gas injector configured to inject a gas into the process chamber; and
   a heater configured to heat the process chamber,
   wherein:
   the gas injector includes:
      a first injector configured to inject a first gas; and
      a second injector configured to inject a second gas,
   a flow rate of the first gas injected from the first injector ranges from 120 sccm to 240 sccm,
   a flow rate of the second gas injected from the second injector ranges from 1,200 sccm to 2,400 sccm, and
   the heater includes:
      a body surrounding the process chamber;
      coils on an inner sidewall of the body; and
      a first temperature controller, a second temperature controller, a third temperature controller, a fourth temperature controller, and a fifth temperature controller, each of which is between the coils adjacent to each other, the first to fifth temperature controllers being configured to independently control temperatures of the first to fifth temperature regions, respectively.

2. The apparatus as claimed in claim 1, wherein:
   the first gas includes dichlorosilane, and
   the second gas includes ammonia ($NH_3$).

3. The apparatus as claimed in claim 1, wherein a ratio of the flow rate of the first gas to a height within the process chamber ranges from 0.895 sccm/cm to 1.590 sccm/cm.

4. The apparatus as claimed in claim 1, wherein:
   the gas injector further includes:
      a third injector configured to inject the first gas; and
      a fourth injector configured to inject the second gas,
   the third injector is adjacent to the first injector, and
   the fourth injector is adjacent to the second injector.

5. The apparatus as claimed in claim 4, wherein:
   a highest level of the first injector is a first level,
   a highest level of the third injector is a second level, and
   the second level is higher than the first level.

6. The apparatus as claimed in claim 1, wherein:
   a temperature in degrees Celsius in the first temperature region of the process chamber is a first temperature,
   a temperature in degrees Celsius in the fifth temperature region of the process chamber is a second temperature, and
   a ratio of the first temperature to the second temperature ranges from 1:1.01 to 1:1.03.

7. The apparatus as claimed in claim 1, wherein each of the first to fifth temperature controllers includes:
   a sensor configured to sense a temperature of a corresponding one of the first to fifth temperature regions;
   a voltage supplier configured to supply a voltage to the coils at a corresponding one of the first to fifth temperature regions; and
   a voltage controller configured to control a voltage supplied to the coils at a corresponding one of the first to fifth temperature regions.

8. The apparatus as claimed in claim 6, wherein a difference between the first temperature and the second temperature ranges from 12° C. to 20° C.

9. The apparatus as claimed in claim 6, wherein a ratio of a difference between the between the first temperature and the second temperature to the flow rate of the first gas ranges from $1/20$° C./sccm to $1/6$° C./sccm.

10. An apparatus for depositing a thin layer, the apparatus comprising:
   a process chamber;
   a support in the process chamber, substrates being supportable on the support at different heights;
   a gas injector configured to inject a gas into the process chamber; and
   a heater configured to heat the process chamber,
   wherein:
   the process chamber includes a first temperature region, a second temperature region, a third temperature region, a fourth temperature region, and a fifth temperature region, which are sequentially provided in a direction from a lower portion of the process chamber toward an upper portion of the process chamber,
   a temperature in degrees Celsius in the first temperature region of the process chamber is a first temperature,
   a temperature in degrees Celsius in the fifth temperature region of the process chamber is a second temperature,
   a ratio of the first temperature to the second temperature ranges from 1:1.01 to 1:1.03, and the heater includes:
  a body surrounding the process chamber;
  coils on an inner sidewall of the body; and
  a first temperature controller, a second temperature controller, a third temperature controller, a fourth temperature controller, and a fifth temperature controller, each of which is between the coils adjacent to each other, the first to fifth temperature controllers being configured to independently control temperatures of the first to fifth temperature regions, respectively.

11. The apparatus as claimed in claim 10, wherein:
the first temperature ranges from 730° C. to 734° C., and
the second temperature ranges from 746° C. to 750° C.

12. The apparatus as claimed in claim 10, wherein:
the gas injector includes:
  a first injector configured to inject a first gas; and
  a second injector configured to inject a second gas,
a flow rate of the first gas injected from the first injector ranges from 120 sccm to 240 sccm, and
a flow rate of the second gas injected from the second injector ranges from 1,200 sccm to 2,400 sccm.

13. The apparatus as claimed in claim 12, wherein:
the gas injector further includes:
  a third injector configured to inject the first gas; and
  a fourth injector configured to inject the second gas,
a highest level of the third injector is higher than a highest level of the first injector,
a highest level of the fourth injector is higher than a highest level of the second injector,
a flow rate of the first gas injected from the third injector ranges from 120 sccm to 240 sccm, and
a flow rate of the second gas injected from the fourth injector ranges from 1,200 sccm to 2,400 sccm.

14. A method of depositing a thin layer, the method comprising:
loading substrates at different heights in the process chamber of the apparatus as claimed in claim 1;
injecting the first gas and the second gas into the process chamber to deposit the thin layer on each of the substrates; and
independently controlling temperatures at different heights in the process chamber,
wherein:
the first gas is injected into the process chamber at a flow rate that ranges from 120 sccm to 240 sccm, and
the second gas is injected into the process chamber at a flow rate that ranges from 1,200 sccm to 2,400 sccm.

15. The method as claimed in claim 14, wherein:
independently controlling the temperatures at the different heights in the process chamber includes:
  independently sensing a temperature of each of the first to fifth temperature regions of the process chamber; and
  independently controlling the temperatures of the first to fifth temperature regions to first to fifth temperatures, respectively, by independently controlling a voltage supplied to the coils at each of the first to fifth temperature regions.

16. The method as claimed in claim 15, wherein independently controlling the temperatures at the different heights in the process chamber includes independently controlling the first and fifth temperatures such that a ratio of the first temperature in degrees Celsius to the fifth temperature in degrees Celsius ranges from 1:1.01 to 1:1.03.

17. The method as claimed in claim 15, wherein independently controlling the temperatures at the different heights in the process chamber includes independently controlling the first and fifth temperatures such that a difference between the first temperature and the fifth temperature ranges from 12° C. to 20° C.

18. The method as claimed in claim 14, wherein:
the first gas includes dichlorosilane,
the second gas includes ammonia ($NH_3$), and
the thin layer includes silicon nitride.

* * * * *